United States Patent
Bothe et al.

(10) Patent No.: US 7,688,597 B2
(45) Date of Patent: Mar. 30, 2010

(54) POWER SUPPLY CIRCUIT WITH THREE-DIMENSIONALLY ARRANGED CIRCUIT CARRIERS, AND PRODUCTION METHOD

(75) Inventors: Michael Bothe, Munster (DE); Stefan Morbe, Hasbergen (DE); Michael Becks, Telgte (DE); Peter Grad, Munster (DE)

(73) Assignee: Power Systems Technologies GmbH, Ostbevern (DE)

( * ) Notice: Subject to any disclaimer, the term of this patent is extended or adjusted under 35 U.S.C. 154(b) by 951 days.

(21) Appl. No.: 10/840,051

(22) Filed: May 6, 2004

(65) Prior Publication Data

US 2005/0047103 A1    Mar. 3, 2005

(30) Foreign Application Priority Data

May 16, 2003   (EP)   ................................ 03011229

(51) Int. Cl.
*H05K 7/00*   (2006.01)
(52) U.S. Cl. .................................... 361/760
(58) Field of Classification Search ................ 361/760, 361/780, 801, 782
See application file for complete search history.

(56) References Cited

U.S. PATENT DOCUMENTS

| | | | | |
|---|---|---|---|---|
| 4,712,160 | A * | 12/1987 | Sato et al. | 361/710 |
| 4,925,723 | A * | 5/1990 | Bujatti et al. | 428/137 |
| 5,015,981 | A * | 5/1991 | Lint et al. | 336/65 |
| 5,990,421 | A | 11/1999 | Yee | |
| 6,225,560 | B1 * | 5/2001 | Machado | 174/556 |
| 6,454,604 | B1 | 9/2002 | Currie et al. | |
| 2001/0008479 | A1 | 7/2001 | Branchevsky | |
| 2002/0136031 | A1 * | 9/2002 | Yamaguchi et al. | 363/18 |

(Continued)

FOREIGN PATENT DOCUMENTS

DE   3839505   2/1990

(Continued)

OTHER PUBLICATIONS

M. Bothe, 3-D Packaging bei Stromversorgungen, F&M 101 (1993), pp. 111-113 (see p. 1, bottom of second col. for an English abstract).

(Continued)

*Primary Examiner*—Dean A. Reichard
*Assistant Examiner*—Abiy Getachew
(74) *Attorney, Agent, or Firm*—Robert G. Crouch; Bobby B. Soltani; Marsh Fischmann & Breyfogle LLP

(57) ABSTRACT

The present invention relates to a power supply circuit comprising at least one transformer which is connected to a primary side circuit and to a secondary side circuit. The present invention further relates to a method for producing such a power supply circuit. To provide an improved power supply circuit which has a reduced size and increased power density and offers more flexibility in the formation of the safety distances between primary side and secondary side, the primary side circuit and the secondary side circuit are each mounted on at least one separate circuit carrier, said circuit carriers being mechanically and electrically coupled to one another and arranged in at least two different planes. According to advantageous embodiments, said circuit carriers may be arranged in planes that are either parallel with or transverse to one another.

23 Claims, 4 Drawing Sheets

U.S. PATENT DOCUMENTS

2003/0226688 A1* 12/2003 Jairazbhoy et al. .......... 174/252
2004/0139589 A1*  7/2004 Bothe et al. ................ 29/25.41

FOREIGN PATENT DOCUMENTS

| | | |
|---|---|---|
| DE | 198 08 089 | 9/1999 |
| DE | 100 18 229 | 10/2001 |
| DE | 100 30 605 | 1/2002 |
| EP | 0 814 518 | 12/1997 |
| JP | 62-5696 | 1/1987 |
| JP | 3-30457 | 3/1991 |
| JP | 5-93073 | 12/1993 |
| JP | 10-503585 | 3/1998 |
| JP | 11186687 | 7/1999 |
| JP | 2000-92838 | 3/2000 |
| JP | 2001-86752 | 3/2001 |
| WO | WO 95/29406 | 11/1995 |
| WO | WO 99/43074 | 8/1999 |

OTHER PUBLICATIONS

English translation of Japanese Office action dated Feb. 7, 2006, cited in corresponding Japanese Patent Application No. 2004-141323.

Japanese Office action dated Aug. 2, 2005 with English translation, cited in corresponding Japanese Patent Application No. 2004-141323.

* cited by examiner

US 7,688,597 B2

POWER SUPPLY CIRCUIT WITH THREE-DIMENSIONALLY ARRANGED CIRCUIT CARRIERS, AND PRODUCTION METHOD

BACKGROUND OF THE INVENTION

1. Field of the Invention

The present invention relates generally to power supply circuits. More particularly, the present invention relates to a power supply circuit comprising at least one transformer which is connected to a primary side circuit and to a secondary side circuit. Furthermore, the present invention relates to a method for producing such a power supply circuit.

2. Description of the Related Art

Power supply circuits, such as DC power supplies, are nowadays designed as linear 50 Hz transformers or as switched-mode mains power supplies with switching frequencies within a range of a few kilohertz up into the megahertz range. The general attempt has been made to reduce the volume of the circuit, and thus of the device, to increase user friendliness especially in chargers for mobile applications. With the configuration as a switched-mode mains power supply and the resulting omission of the relatively large and heavy 50 Hz transformer, a first step has been made towards a reduction of the size.

With the present designs of power supply circuits in which use is made of a two-dimensional printed circuit board according to FIG. 9 and of corresponding connector housings and output lines, miniaturization is however very limited. For instance, integration into the device to be power-supplied, i.e. the load, is most of the time not possible. The power density of today's low-power supply units is about 2 to 3 W/inch$^3$.

Furthermore, miniaturization is ruled out by the use of conventional discrete components, such as electrolyte capacitors or discrete resistors. Such components have specific minimum dimensions that must be adhered to even in cases where the typical values of said component are reduced. An alternative which allows smaller dimensions would be desirable.

International patent application WO 99/43074 discloses an arrangement in which a circuit for converting mains voltage into a lower voltage is accommodated in an output connector of the power supply device. Power supply circuits that have so far been realized have, however, a volume that is too large for realizing said arrangement in a really user-friendly way. Therefore, a corresponding miniaturization of the power supply circuit would be needed for use in such a device.

In the known constructional form of the plug-in power supply unit with output line, there is a power loss that cannot be avoided on the output line because relatively high power is present at the output side and the output line cannot be designed with any desired large cross-section for reducing the ohmic resistance accordingly. As shown in DE 100 18 229 A1, the output voltage is e.g. controlled at the primary side, so that only a few components are needed at the secondary side. A load-dependent voltage drop on the secondary line is bound to occur in this arrangement. This leads to unavoidable inaccuracy in the output voltage on the output connector because the voltage drop on the line cannot be measured during operation and is thus not available for controlling the output voltage. An omission of the output line, which is possible with a corresponding miniaturization and accommodation of the circuit in the output connector of the device according to WO 99/43074, would eliminate said drawback.

Furthermore, to ensure a standardized electrical isolation of the primary circuit and the secondary circuit, air and leakage paths must be observed on the circuit carrier. In the case of a two-dimensional printed circuit board, as shown in FIG. 9, this always entails a great distance between the components of the primary side and those of the secondary side. Therefore, components must not be placed on the area marked by reference numeral 101 in FIG. 9. The distance must e.g. be at least 6.4 mm upon application of the standard EN60950 when the mains voltage is 230 V. Therefore, there is a need for more flexibility in the configuration of the air and leakage paths.

SUMMARY OF THE INVENTION

Given these problems with the existing technology, there exists a need for an improved power supply circuit which has a reduced size and increased power density and offers more flexibility in the design of the safety distances between primary side and secondary side.

These and other objects of the present invention will become apparent hereinafter.

To achieve these objects, a power supply circuit comprises at least one transformer which is connected to a primary side circuit and to a secondary side circuit. The primary side circuit and the secondary side circuit are each mounted on at least one separate circuit carrier, said circuit carriers being mechanically and electrically coupled with one another and arranged in at least two different planes.

According to another aspect of the present invention, a method for producing a power supply circuit comprising at least one transformer, a primary side circuit and a secondary side circuit is provided, said method comprising the steps of mounting the primary side circuit on at least one primary side circuit carrier; mounting the secondary side circuit on at least one separate secondary side circuit carrier; and electrically and mechanically coupling the circuit carriers with the transformer, the circuit carriers being arranged in at least two different planes.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention as illustrated in the accompanying drawings, wherein.

DETAILED DESCRIPTION OF THE INVENTION

The illustrated embodiments of the present invention will be described with reference to the figure drawings, wherein like elements and structures are indicated by like reference numbers.

Figure 1:
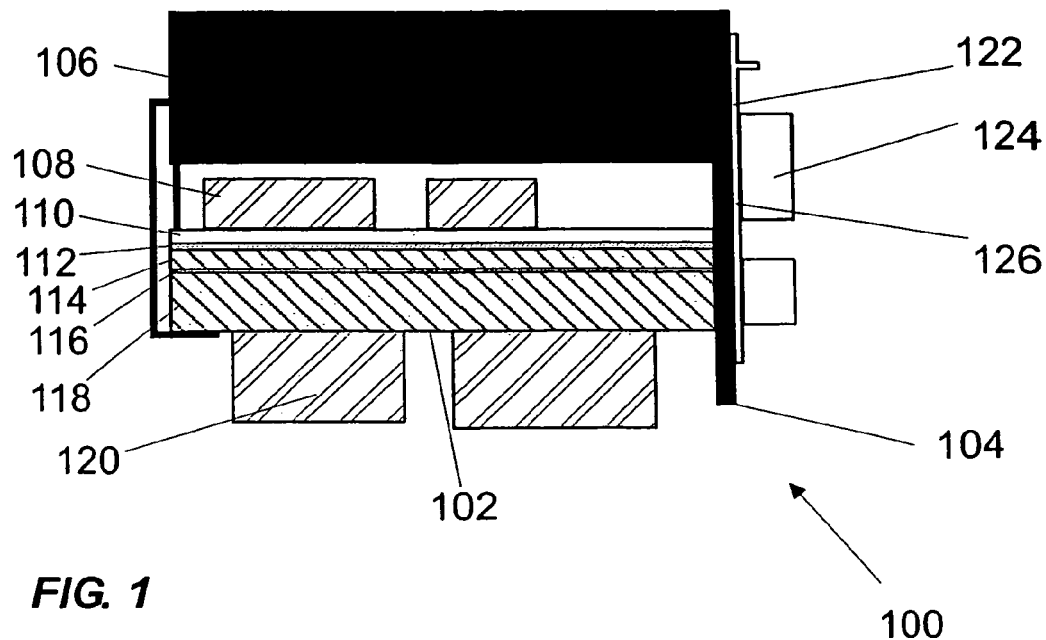
FIG. 1 illustrates a schematic sectional view through a power supply circuit according to a first embodiment.

Referring now to FIG. 1, an embodiment of a power supply circuit according to the present invention shall be explained. The power supply circuit 100 comprises a transformer 106, which may be of a piezoelectric or magnetic type, and a primary side circuit 102 connected to the input of transformer 106. In the illustrated embodiment, transformer 106 is a conventional electromagnetic transformer with a comparatively large coil body. The secondary side circuit 104 is mechanically fixed to the coil body and electrically connected to the output of transformer 106. According to the invention, the primary side circuit 102 and the secondary side circuit 104 are arranged on different circuit carriers 122, 110, 114 and 118. The individual layers of the primary side circuit 102 are substantially arranged to be transverse to the plane of the secondary side circuit 104.

Moreover, the primary side circuit 102 is distributed over different circuit carriers 110, 114 and 118 that are stacked in parallel with one another. To realize optimum electrical characteristics together with a high power density, discrete and integrated components are combined at the primary side. The discrete components 108 of the primary side are here mounted on a ceramic carrier 110, which may include integrated resistors. Such integrated resistors can e.g. be realized with the help of the thick film technology on a ceramic substrate. Aluminum oxide is often used as the ceramic substrate, which offers the advantage of a high thermal conductivity and high insulation strength.

An insulation layer 112, in which vias (not explicitly shown) are provided for the electrical connection, couples the circuit carrier 110 with a circuit carrier 114 which includes integrated capacitors of a mean dielectric strength. A ground metallization 116 is in contact with the circuit carrier 118, which contains integrated capacitors of a high dielectric strength, as are e.g. needed for part of the input filter. Such integrated capacitors shall be explained in more detail later with reference to FIGS. 5 to 8. The circuit carrier 118 has mounted thereon further components 120 of the discrete type, which are needed for the input filter at the primary side.

At the secondary side, a leadframe 122, on which discrete components 124 are arranged, is used as a circuit carrier in the present embodiment. However, it is also possible to use a so-called molded interconnect device (MID).

Insulation 126 provides the necessary electrical insulation between the hybrid printed circuit board of the primary side 102 and the leadframe 122 of the secondary side.

The layers as shown may be arranged in any desired sequence. The solution shown in FIG. 1 offers, however, the advantage that the sequence of the layers follows approximately the circuit diagram from the input side to the output side. The components of the secondary side may be arranged either in parallel with the layers of the primary side or, as is shown here, they may be co-integrated into the coil body of the transformer 106. Like the components of the primary side, the components of the secondary side may also be distributed over several layers. The component carrier for the discrete components of the secondary side may be designed either as a leadframe 122 or directly be part of the coil body in the case of a magnetic transformer. In the case of a piezoelectric transformer the component carrier may be integrated into the transformer mounting.

The electrical connection between the components of the individual layers is established through so-called vias, i.e. through holes, within the individual layers. For the sake of clarity these are however not shown.

Figure 2:
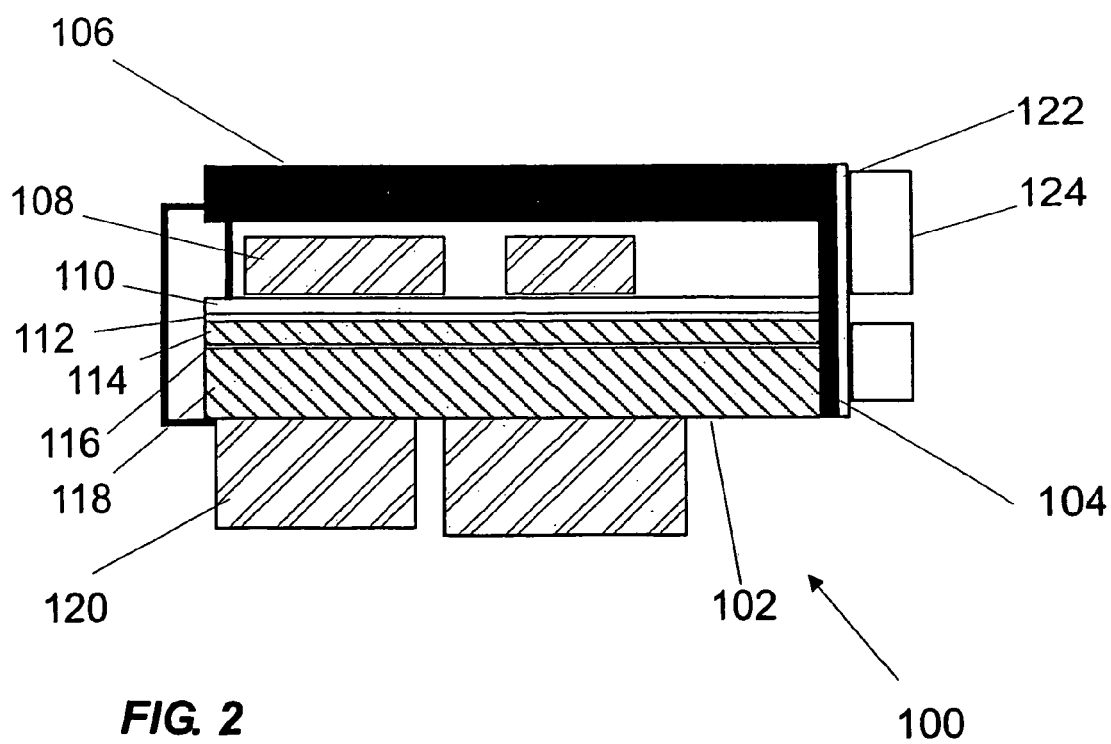
FIG. 2 shows a power supply circuit according to a second embodiment.

A further embodiment wherein a piezoelectric transformer is provided as the transformer 106, is shown in FIG. 2. In comparison with FIG. 1, the much smaller overall height of the piezoelectric transformer 106, which is only about a fifth of the overall height of the coil body, can be seen.

Figure 3:
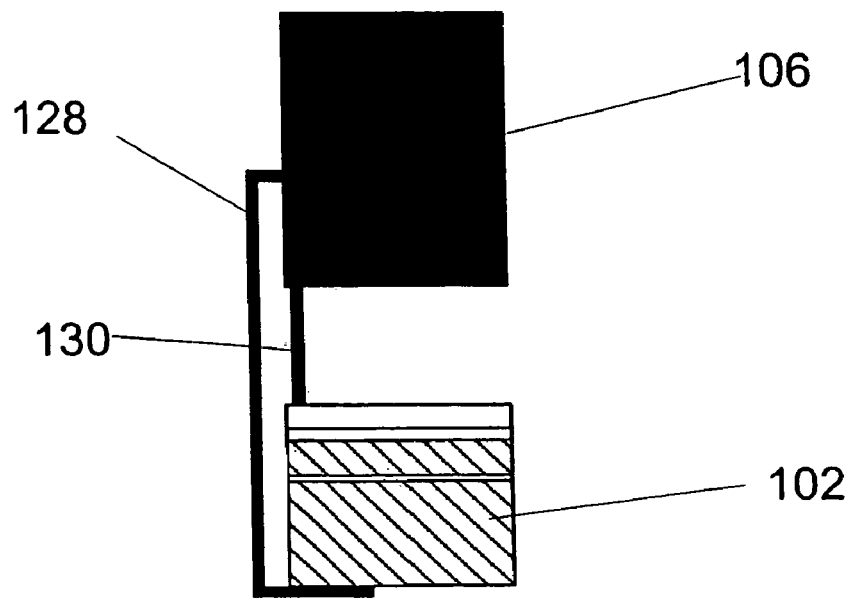
FIG. 3 shows a detail of the power supply circuit according to FIG. 1.

FIG. 3 shows a detail of FIG. 1, which illustrates the contacting of the transformer 106 with the primary-side hybrid printed circuit board 102. The coil body of the transformer 106 is constructed in the present embodiment such that a contact is possible on both the upper side and the lower side of the hybrid printed circuit board 102.

Figure 4:
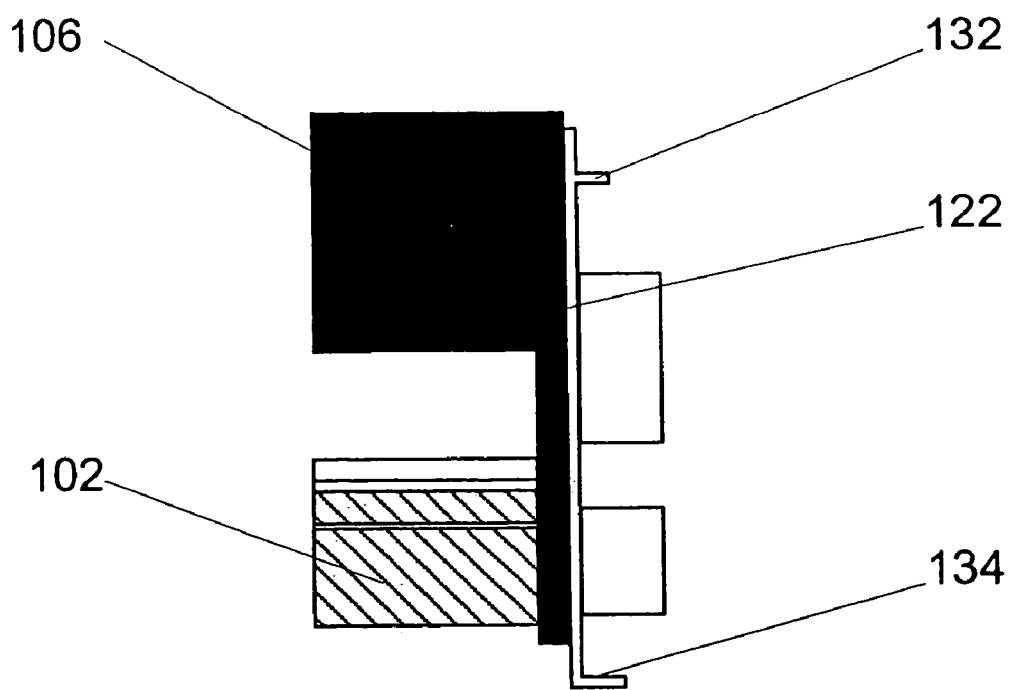
FIG. 4 shows a further detail of the power supply circuit according to FIG. 1.

FIG. 4 shows a detail of FIG. 1, which illustrates the insulation between the hybrid printed circuit board 102 of the primary side and the leadframe 122 of the secondary side. In an alternative embodiment, the leadframe 122 is directly configured as an electrical contact for a main board. Reference numeral 134 designates the corresponding contacting pad for the main board. Moreover, a winding location 132 for the transformer coil 106 is formed on the leadframe 122.

Very different techniques can be employed for producing the capacitors needed at the primary side and the secondary side. For some capacitors of a high capacitance, which are realized as discrete components, wound electrolyte capacitors may be used for reasons of costs. Furthermore, apart from tantalum capacitors, ceramic capacitors may be used.

Ceramic capacitors have the advantage that they have improved high-frequency characteristics on the one hand and that even with a high current carrying capacity they have a low equivalent serial resistance (ESR) on the other hand. To achieve enough capacitance in the case of a small area, said capacitors are often produced by multilayer technology (MLC)

A further known possibility of producing such ceramic capacitors consists in a configuration by way of a monolayer structure wherein only one single layer of dielectric material is used. This yields a simple way of production. Since the panel thickness must be at least 0.2 mm for reasons of mechanical stability, a high dielectric strength is achieved.

A further possibility of configuration is offered by so-called multi-layer components in which many layers (up to 300) of dielectric material are stacked and sintered. Electrodes are positioned between the individual layers. High capacitance values can be achieved with this method, the dielectric strength being adjustable via the distance of the individual layers with respect to one another. With an increased dielectric strength, a low capacitance is achieved at the same size because the layers become thicker.

To achieve a maximum miniaturization upon application in mains-operated power supplies, such capacitors are integrally constructed in the circuit carrier proper. An example of a multilayer capacitor integrated into the circuit carrier is given in US patent application US2001/0008479 A1. A multilayer capacitor is here formed in a recess of the circuit carrier and firmly connected to the substrate by subsequent pressing and sintering.

Figure 5:
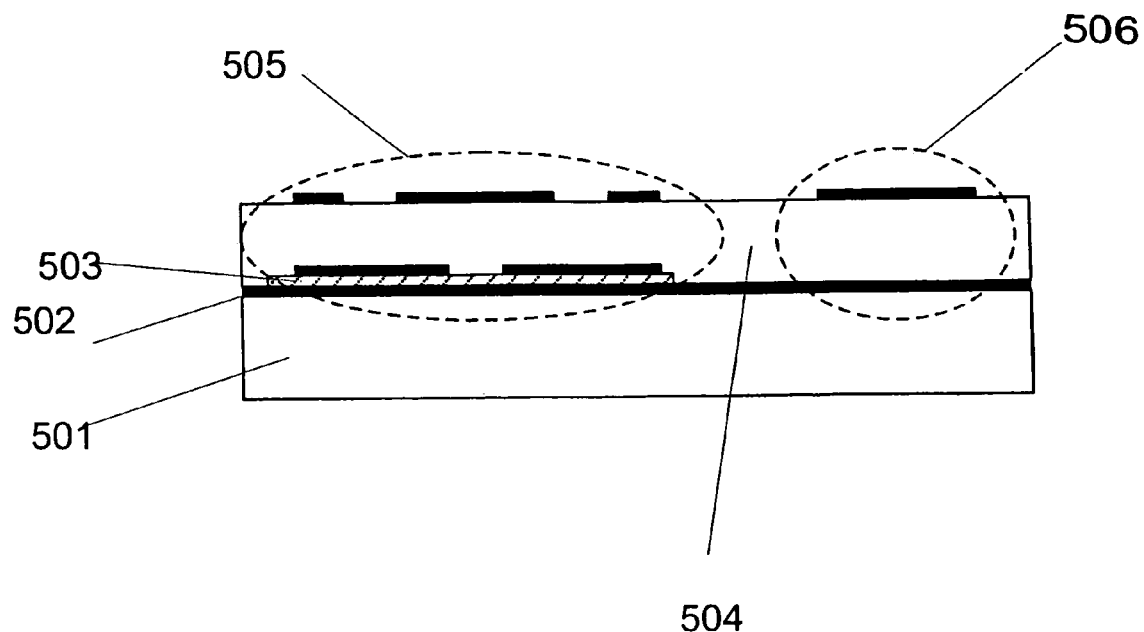
FIG. 5 illustrates a schematic sectional view of a circuit carrier with integrated capacitors according to a first embodiment.

A possible form of configuration for integrated capacitors is shown in FIG. 5. Integrated, by way of example, are a dielectric 504, a capacitor for the low-voltage range without ground connection 505 and a capacitor with ground connection 506, also for the low voltage range. The layer 501 contains a multilayer capacitor which shows a high capacitance and is designed for high voltages. The ground metallization 502 is inserted between the two capacitor planes. A passivation layer 503 is provided for insulation with respect to the ground potential for capacitor 505.

Figure 6:
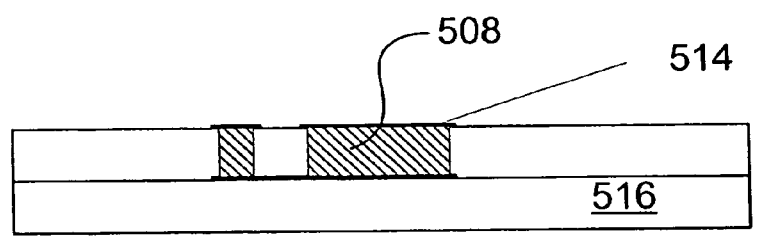
FIG. 6 illustrates a schematic sectional view of a circuit carrier with integrated capacitors according to a second embodiment.
Figure 7:
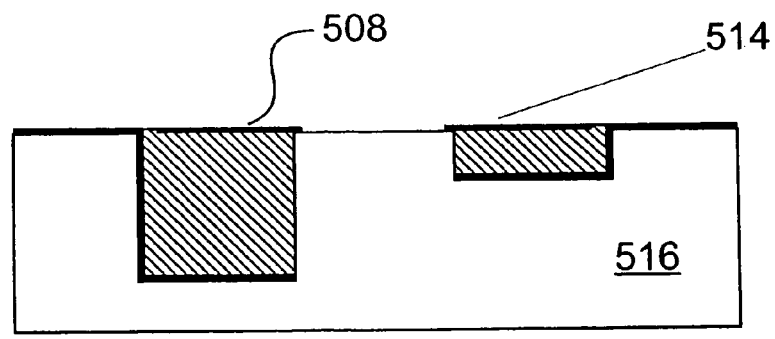
FIG. 7 illustrates a schematic sectional view of a circuit carrier with integrated capacitors according to a third embodiment.
Figure 8:
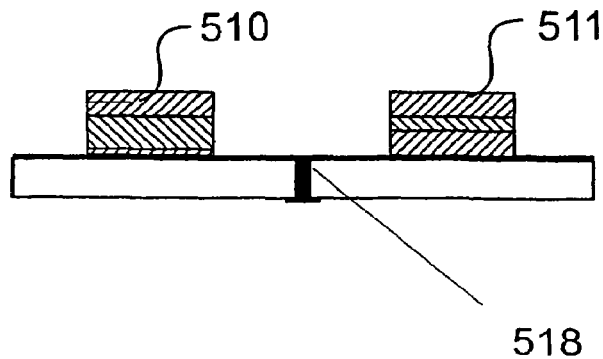
FIG. 8 illustrates a schematic sectional view of a circuit carrier with integrated capacitors according to a fourth embodiment.
Figure 9:
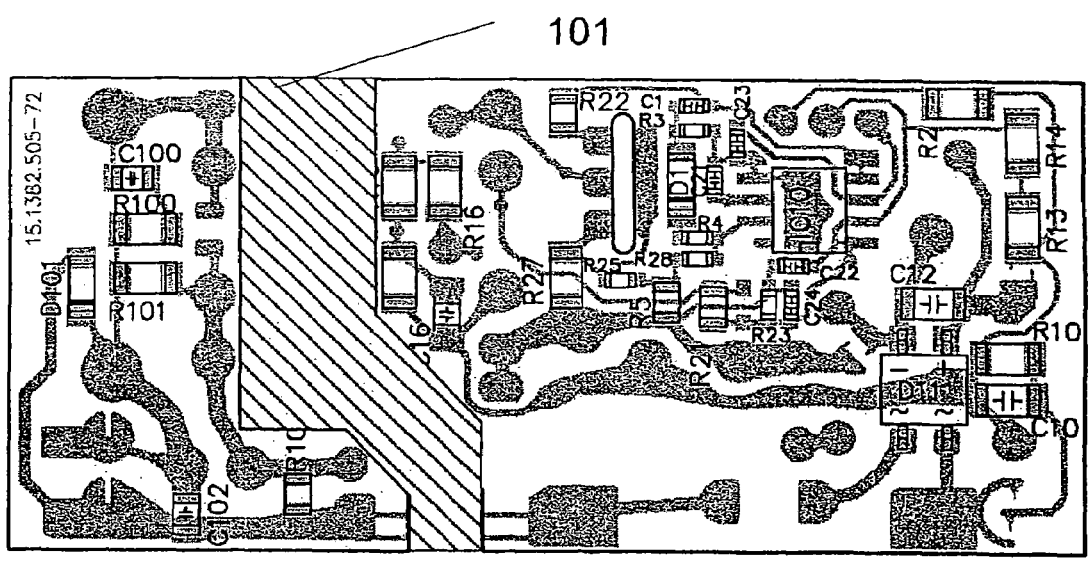
FIG. 9 shows the circuit carrier of a power supply circuit according to the prior art.

FIGS. 6 to 8 show further possible forms of configurations for integrated capacitors according to German patent application DE 103 02 104.3, wherein a dielectric 508 is embedded in corresponding openings of an insulating substrate 516. Metallizations 514 provide the required electrical connections. When said structures are made, a precursor of the dielectric 508 is first introduced into the opening, which is optionally metallized, and then converted by a pressing and sintering process into the final state. Individual capacitors 510, 511 that are separated from one another can be obtained by subsequent removal of ambient layers (FIG. 8). Moreover, FIG. 8 shows a possible configuration for a via 518 in an exemplary way.

Of course, all of the other possible methods can be used for producing integrated capacitors and passive components, for instance also the use of so-called LTCC (low temperature co-fired ceramics).

The production of a power supply circuit of the invention shall now be described in detail.

For producing the power supply circuit according to the invention, as is e.g. shown in FIG. 1, the primary side and secondary side circuits 102 and 104 are first constructed separately. The primary side circuit 102 may here be a multilayer structure of ceramic substrates stacked one upon the other, into which integrated capacitors, as shown in FIGS. 5 to 8, are embedded. The individual layers are mechanically held together through joint sintering, adhesive bonding or soldering.

In a next work step, discrete components 108, 120 are mounted and e.g. electrically contacted by soldering.

The secondary side circuit 104 can e.g. be formed by a leadframe 122 on which discrete components 124 are also mounted. The primary side circuit is now connected mechanically and electrically to a transformer 106. An insulation layer 126 is provided on the transformer and has mounted thereon the leadframe 122 with the secondary side circuit.

To keep the air and leakage paths required for electrical safety as short as possible, the power supply circuit may optionally be cast.

Finally, the whole power supply circuit 100 can additionally be connected to a base plate. A further coating, e.g. one consisting of an electrically insulation plastic material, can finally provide the required stability and an improved electrical insulation.

The present invention is based on the fundamental idea to divide the circuit into individual partial circuits and to mount the various required components on separate circuit carriers or to integrate them into said carriers. According to the invention said circuit carriers are arranged in at least two different planes that can extend either in parallel with or transverse to one another. This can improve the power density considerably, and new applications are possible in environments in the case of which size or form factor play a decisive role. The power density can be multiplied by such a three-dimensional arrangement of the separate circuit carriers; the word three-dimensional means here that the circuit carriers are arranged in layers and stacked and/or arranged transverse to one another. Furthermore, this yields improved possibilities of forming the air and leakage paths by exploiting the third dimension.

In the simplest case the primary side circuit and the secondary side circuit are each mounted on a separate circuit carrier, the circuit carriers being coupled to one another mechanically and electrically and arranged in two different planes. However, in order to achieve a further miniaturization, each of the two circuits can be subdivided once again and accommodated on partial circuit carriers.

According to an advantageous embodiment the plane defined by the secondary side circuit carrier extends substantially in a direction transverse to the plane defined by the primary side circuit carrier. This arrangement permits a particularly large spatial distance between the primary side circuit and the secondary side circuit while requiring extremely little space at the same time.

When the primary side circuit is subdivided into different partial circuits that are mounted on a plurality of primary side circuit carriers whose planes extend substantially in parallel with one another, an extraordinary spatial compactness can be achieved. With such an arrangement, especially in the case of a secondary side circuit carrier plane extending transverse to said circuit carrier planes, the space which is needed and is predetermined by the secondary side circuit carrier can be exploited in a particularly efficient way.

A particularly great dielectric strength and high electrical safety can be achieved in that the at least one primary side circuit carrier is separated by an electrically insulating layer, e.g. a plastic layer, from the at least one secondary side circuit carrier.

The use of integrated circuit carriers, e.g. for the integration of resistors that can preferably be produced by thick film technology, permits an easy production together with a considerable miniaturization. A particularly space-saving arrangement can be achieved in that integrated capacitors of a mean or high dielectric strength are embedded into the respective circuit carrier.

Depending on electrical requirements, such integrated capacitors can be produced as a monolayer structure or a multilayer structure. Alternatively, it is also possible to use integrated capacitors that are produced by a method in which a precursor of the dielectric is introduced into corresponding, partly metallized openings of a circuit carrier. Such integrated capacitors are shown in German patent application DE 103 02 104.3.

For adapting the electrical properties to specific requirements depending on the application, the use of discrete active and/or passive components is also possible Robustness and an easy inexpensive producibility count above all among the advantages of such discrete components.

Depending on the external requirements made on the power supply circuit, either a magnetic or a piezoelectric transformer may be used. Conventional electromagnetic transformers offer the advantage of an inexpensive producibility and an easy electronic control. On the other hand, piezoelectric voltage transformers constitute the alternative with the greatest miniaturization potential because piezoelectric voltage transformers only require about a fifth of the overall height of an electromagnetic transformer.

The use of a ceramic material as the circuit carrier guarantees an improved heat dissipation from components that are heating up during operation. Therefore, said components can be arranged close to one another without any further cooling bodies, which also contributes to miniaturization.

To ensure mechanical stability and electrical contacting also under environmental influences, such as impacts and changing temperatures, the individual circuit carriers may be connected to one another mechanically by way of joint sintering, adhesive bonding or soldering.

For an efficient establishment of the electrical connections needed between separate circuit carriers, vias may be provided in insulation layers especially when the circuit carriers are arranged in a stacked arrangement one on top of the other.

To reduce the prescribed air and leakage paths and thus to make the total assembly even more compact, the whole circuit may be embedded in an electrically insulating coating, for instance by casting.

According to a further advantageous embodiment, components may be integrated into the coil body of the transformer or the transformer mounting. This is e.g. done by using construction and connection techniques such as 3D-MID (three-dimensional molded interconnect device) or a leadframe. The leadframe or the 3D-MID component may have a contact to the main board, the output contact, at the same time.

While the invention has been described with respect to the physical embodiments in accordance therewith, it will be apparent to those skilled in the art that various modifications, variations and improvements of the present invention may be made in the light of the above teachings and within the purview of the appended claims without departing from the spirit and intended scope of the invention.

In addition, those areas in which it is believed that those ordinary skilled in the art are familiar have not been described herein in order not to unnecessarily obscure the invention described herein. Accordingly, it is to be understood that the invention is not to be limited by the specific illustrated embodiments, but only by the scope of the appended claims.

What is claimed is:

1. A power supply circuit comprising:
   at least one transformer that includes a primary winding and a secondary winding;
   a primary side circuit including a primary side circuit carrier that includes a plurality of components at least a subset of which are substantially oriented in a first plane, the primary side circuit being electrically connected to the primary winding of the transformer;
   a secondary side circuit including a secondary side circuit carrier that includes a plurality of components at least a subset of which are substantially oriented in a second plane substantially perpendicular to the first plane, the secondary side circuit being electrically connected to the secondary winding of the transformer wherein at least one of the circuit carriers discharges dissipated heat produced during operation to the outside.

2. The power supply circuit according to claim 1, wherein at least one of the primary side circuit carrier and the secondary side circuit carrier comprises an integrated resistor.

3. The power supply circuit according to claim 1, wherein at least one of the circuit carriers comprises integrated capacitors of a medium dielectric strength.

4. The power supply circuit according to claim 3, wherein the integrated capacitors are produced as a monolayer structure.

5. The power supply circuit according to claim 3, wherein the integrated capacitors are produced as a multilayer structure.

6. The power supply circuit according to claim 3, wherein the integrated capacitors can be produced by introducing a dielectric precursor into recesses of the circuit carrier.

7. The power supply circuit according to claim 1, wherein at least one of the circuit carriers comprises integrated capacitors of a high dielectric strength.

8. The power supply circuit according to claim 7, wherein the integrated capacitors are produced as a monolayer structure.

9. The power supply circuit according to claim 7, wherein the integrated capacitors are produced as a multilayer structure.

10. The power supply circuit according to claim 7, wherein the integrated capacitors can be produced by introducing a dielectric precursor into recesses of the circuit earner.

11. The power supply circuit according to claim 1, wherein at least one of the circuit carriers comprises discrete active or passive components.

12. The power supply circuit according to claim 1, wherein the transformer is an electromagnetic transformer.

13. The power supply circuit according to claim 12, wherein the transformer includes a coil body, and wherein electrical components are integrated into the coil body of the transformer.

14. The power supply circuit according to claim 1, wherein at least one of the circuit carriers are produced from a ceramic material.

15. The power supply circuit according to claim 1, wherein the individual circuit carriers are mechanically connectable to one another by means of joint sintering, adhesive bonding or soldering.

16. The power supply circuit according to claim 1, wherein the individual circuit carriers are electrically connectable to one another through vias in at least one insulation layer.

17. The power supply circuit according to claim 1, wherein the power supply circuit is surrounded at least in part by an electrically insulating coating.

18. The power supply circuit according to claim 17, wherein the electrically insulating coating is formed by a casting material.

19. A power supply circuit comprising at least one transformer that includes a primary winding connected to a primary side circuit and a secondary winding connected to a secondary side circuit,
   wherein components of the primary side circuit and components of the secondary side circuit are each connected to at least one separate circuit carrier, said circuit carriers being coupled with one another and wherein at least a subset of the components of the primary side circuit and at least a subset of the components of the secondary side circuit are arranged in at least two different planes,
   wherein components of the primary side circuit are connected to a plurality of primary side circuit carriers wherein the plane defined by the components of the secondary side circuit carrier extends in a direction substantially transverse to the plane defined by the components of the primary side circuit carrier.

20. The power supply circuit according to claim 19, wherein the plurality of primary side circuit carriers are separated by an electrically insulating layer from the secondary side circuit carrier.

21. A method for producing a power supply circuit comprising at least one transformer that includes a primary winding and a secondary winding, a primary side circuit, and a secondary side circuit, said method comprising the following steps:
   connecting components of the primary side circuit to at least one primary side circuit carrier, at least a subset of the components of the primary side circuit being substantially oriented in a first plane;
   connecting components of the secondary side circuit to at least one separate secondary side circuit carrier, at least a subset of the components of the secondary side circuit being substantially oriented in a second plane;
   coupling the primary side circuit with the primary winding of the transformer; and coupling the secondary side circuit with the secondary winding of the transformer;

wherein the first plane is substantially perpendicular to the second plane.

22. The method according to claim 21, wherein the at least one primary side circuit carrier is separated from the at least one secondary side circuit carrier by an electrically insulating layer.

23. A method for producing a power supply circuit comprising at least one transformer that includes a primary winding and a secondary winding, a primary side circuit, and a secondary side circuit, said method comprising the following steps:

connecting components of the primary side circuit to at least one primary side circuit carrier, at least a subset of the components of the primary side circuit being substantially oriented in a first plane;

connecting components of the secondary side circuit to at least one separate secondary side circuit carrier, at least a subset of the components of the secondary side circuit being substantially oriented in a second plane;

coupling the primary side circuit with the primary winding of the transformer; and coupling the secondary side circuit with the secondary winding of the transformer;

wherein the first plane is substantially perpendicular to the second plane, and wherein components of the primary side circuit are connected to a plurality of primary side circuit carriers.

* * * * *